US011333716B2

(12) United States Patent
Suzuki

(10) Patent No.: US 11,333,716 B2
(45) Date of Patent: May 17, 2022

(54) ELECTRONIC DEVICE AND POWER RECEIVING CONTROL METHOD THEREOF

(71) Applicant: RENESAS ELECTRONICS CORPORATION, Tokyo (JP)

(72) Inventor: Takayuki Suzuki, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 17/065,273

(22) Filed: Oct. 7, 2020

(65) Prior Publication Data

US 2021/0123985 A1    Apr. 29, 2021

(30) Foreign Application Priority Data

Oct. 25, 2019    (JP) .............................. JP2019-194773

(51) Int. Cl.
*G01R 31/68* (2020.01)
*G06F 1/26* (2006.01)
*G06F 13/42* (2006.01)
*G06F 13/38* (2006.01)

(52) U.S. Cl.
CPC .............. *G01R 31/68* (2020.01); *G06F 1/266* (2013.01); *G06F 13/385* (2013.01); *G06F 13/4282* (2013.01); *G06F 2213/0042* (2013.01)

(58) Field of Classification Search
CPC .... G06F 1/266; G06F 13/4282; G06F 13/385; G06F 1/28; G06F 1/3206; G06F 2213/0042; H02J 7/00; H02J 7/0068
See application file for complete search history.

(56) References Cited

U.S. PATENT DOCUMENTS

| | | | |
|---|---|---|---|
| 10,761,553 B2 * | 9/2020 | Sporck .................. | H02J 7/0072 |
| 2018/0060201 A1 * | 3/2018 | Newberry ............... | G06F 1/266 |
| 2018/0069395 A1 * | 3/2018 | Morii ....................... | H01B 7/36 |
| 2019/0204895 A1 * | 7/2019 | Kitanosako ......... | G06F 13/4295 |

OTHER PUBLICATIONS

USB Type-C(TM) Cable and Connector Specification Revision 1.4, Mar. 29, 2019.

* cited by examiner

*Primary Examiner* — Ryan Johnson
(74) *Attorney, Agent, or Firm* — McDermott Will & Emery LLP

(57) ABSTRACT

To make an excessive power receiving request by a sink when a USB Type-C legacy cable is used. An electronic device includes a first and second terminals connected to a cable, a detection circuit for detecting the voltage of the first and second terminals, and a first or second terminal detected by the detection circuit. It is provided with a controller that determines the type of cable based on the terminal voltage and confirms the power supply capacity of the external electronic device connected via the cable according to the type of cable.

12 Claims, 12 Drawing Sheets

ELECTRONIC DEVICE AND POWER RECEIVING CONTROL METHOD THEREOF

CROSS-REFERENCE TO RELATED APPLICATIONS

The disclosure of Japanese Patent Application No. 2019-194773 filed on Oct. 25, 2019 including the specification, drawings and abstract is incorporated herein by reference in its entirety.

BACKGROUND

The present invention relates to an electronic apparatus, and more particularly, the present invention relates to an electronic apparatus having a USB (Universal Serial Bus) Type-C control function and a system using the same.

The technique which carries out the power supply between device using the communication cable is spreading. For example, USB (Universal Serial Bus) is one of standards for connecting a peripheral device to an information device such as a computer, and power can be supplied at the same time as communication between the information appliances.

The electric power that can be supplied using the USB is specified in the standard. For example, in USB2.0 standard, the power that can be supplied by the standard is determined to be a voltage 5 V, current 500 mA. Further, in USB 3.x standard, x is any one of 0, 1, and 2, and the same applies hereinafter, it is defined that the electric power that can be supplied by the standard is the electric power that can be supplied by the standard is the electric voltage 5 V and the electric current 900 mA. When supplying electric power equal to or higher than the standard supplied electric power specified by USB 2.0 standard and USB 3.x standard, it is required to use standards such as USB BC (Battery Charging Specification) and USB PD (Power Delivery).

It is stipulated that USB Type-C to USB Type-C cables having USB Type-C connectors at both ends are used when supplying and receiving electric power equal to or higher than the standard supply electric power stipulated in USB 2.0 standard and USB 3.x standard without using a USB BC or a USB PD. USB Type-C is one of the standards for USB cables and connectors, and is compatible with data input/output, power supply, and video output.

In USB Type-C, a configuration channel signal (hereinafter referred to as a CC signal) is defined, and a terminal (configuration channel terminal) for a CC signal is provided in USB Type-C of the connectors. Source is a power supply device connects the configuration channel terminal (hereinafter referred to as CC terminal) to the power supply line with a pull-up resistor, the sink is a power receiving device by connecting the CC terminal to the GND line with a pull-down resistor, to determine its role. Therefore, the power feeding device and the power receiving device corresponding to USB Type-C detects the connecting status by monitoring the voltage of the CC terminal.

Also, USB Type-C compliant source is defined as standard supplied power, voltage 5 V—current 1.5 A or voltage 5 V—current 3 A power supply. A pull-up resistor value is defined corresponding to these supplied power. For example, the pull-up resistor is 56 kΩ if the standard supply power, 22 kΩ if the supply power is voltage 5 V—current 1.5 A, and 10 kΩ if the supply power is voltage 5 V—current 3 A. On the other hand, the pull-down resistance of the sink is defined as 5.1 kn. Therefore, the sink detects the connection with the source and confirms the power supply capability of the source by measuring the voltage level of the CC terminal.

There is a disclosed technique below.

[Non-patent Document 1] USB Type-C™ Cable and Connector Specification Revision 1.4

SUMMARY

In USB Type-C, in addition to the USB Type-C to USB Type-C cable as described above, a USB cable (hereinafter, referred to as a USB Type-C legacy cable) having a USB Type-C connector at one end and an existing USB connector at the other end (USB2 0 connector or USB 3.x connector) is defined to ensure connectivity with an existing USB port. For example, "USB Type-C to Standard-A cabling" or the like. Such a USB Type-C legacy cable is used, for example, to connect a host device having a pre-existing interface to a peripheral device having a USB Type-C port. Power supply using USB Type-C legacy cables is limited to USB-standard power supply.

As described above, in the source corresponding to USB Type-C, the CC terminal is connected to the pull-up resistor, but the source corresponding to USB Type-C is not provided with the CC terminal. Thus, in USB Type-C, when using a USB Type-C legacy cable to connect a USB Type-C incompatible source to a USB Type-C compatible sink, a USB Type-C compliant sink is defined to connect a pull-up resistor to the signal line connected to the CC terminal within USB Type-C legacy cable to verify the source's power supply capability. As described above, since the power tolerance when using USB Type-C legacy cable is limited to the USB standard supply power, the resistance value of the pull-up resistor in the cable must be 56 kΩ, which is a resistance value corresponding to the USB standard supply power.

However, if this pull-up resistance value does not meet the value defined for the USB standard supply power, e.g., if the pull-up resistance value is less than 56 kΩ, the sink may require excessive power reception. As a result, the source may be overloaded, leading to source fault.

Other objects and novel features will become apparent from the description of this specification and the accompanying drawings.

Electronic device according to an embodiment, which is connected to an external power supply device via a cable, a first and second terminals connected to the cable, a detection circuit for detecting the voltage of the first and second terminals, the type of cable based on the first or second terminal voltage detected by the detection circuit to determine, and a controller for performing the power supply capacity confirmation of the external power supply device in accordance with the type of cable.

The electronic device according to an embodiment can perform safe power reception without making a power reception request with excessive power to an external power supply device.

DETAILED DESCRIPTION

Figure 1:
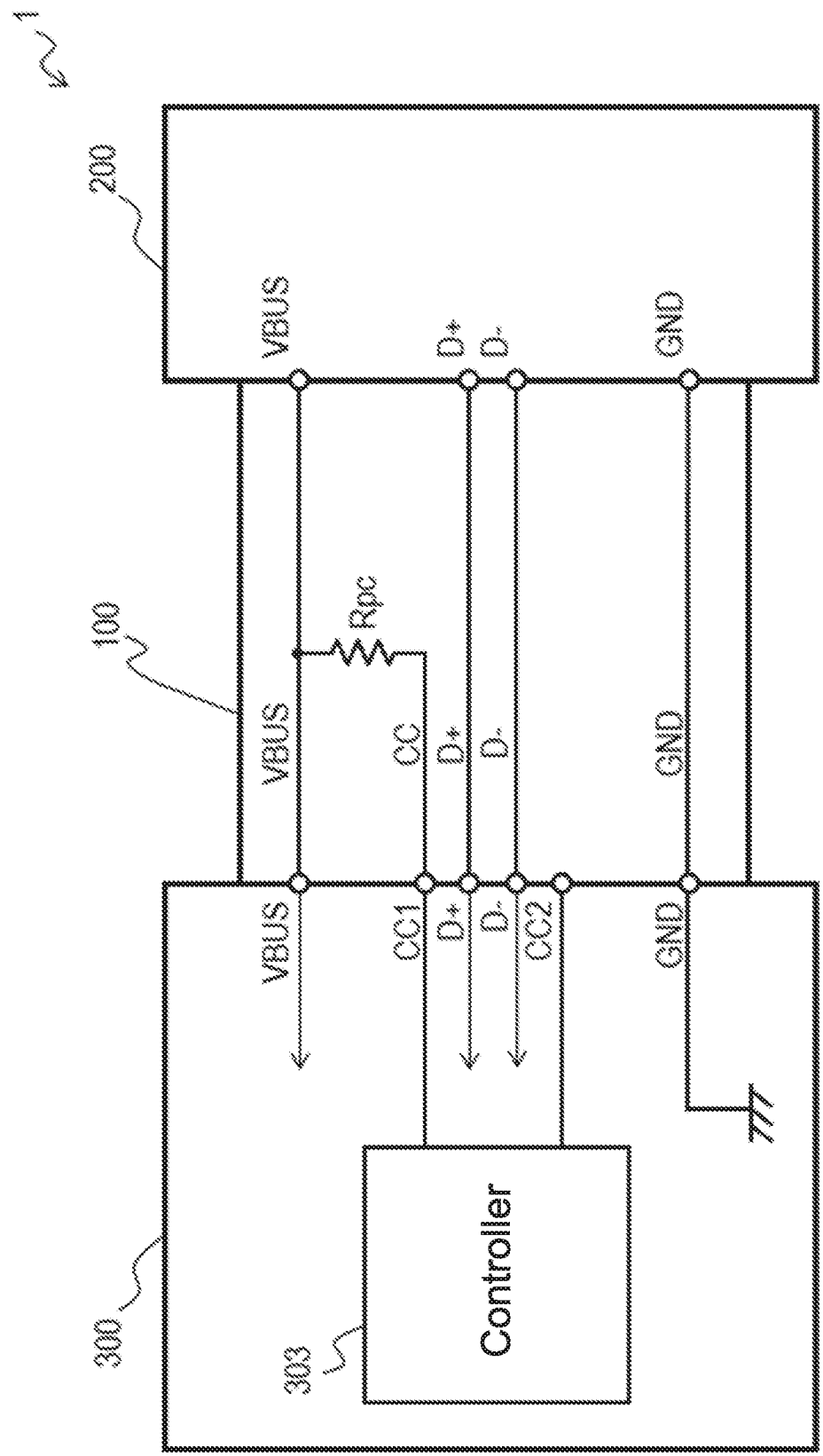
FIG. 1 is a block diagram showing an example of a configuration of a power feeding system according to the first embodiment.

Hereinafter, an electronic apparatus according to an embodiment will be described in detail with reference to the drawings. In the specification and the drawings, the same or corresponding constituent elements are denoted by the same reference numerals, and a repetitive description thereof is omitted. In the drawings, for convenience of description, the calibration may be omitted or simplified. In addition, at least a portion of each of the embodiments may be arbitrarily combined with each other.

Embodiment 1

Hereinafter, Embodiment 1 will be described with reference to the drawings.

FIG. 1 is a block diagram of a power supply system 1 according to the first embodiment. The power supply system 1 includes electronic devices 200 and 300. Electronic device 200 is a power supply device (hereinafter, referred to as source 200) and the electronic device 300 is a power receiving device (hereinafter, referred to as sink 300). The source 200 and the sink 300 are connected via a detachable USB cable 100.

USB cable 100 has a connector at least one end corresponding to USB Type-C, comprising a CC line as a signal line in addition to VBUS line and the GND line. FIG. 1 illustrates, by way of example, a USB Type-C legacy cable having a USB Type-C capable connector at one end and a pre-existing USB connector at the other end (USB2 0 connector or USB 3 x connector). As described above, the CC line of the USB cable 100 is connected to the pull-up resistor Rpc in order to determine the connected state or the like of USB Type-C compatible device based on the voltage of the CC terminal.

Source 200 has a USB Type-C non-compliant port. For example, a port that does not support USB Type-C is a USB 2.0 port or a USB 3.x port. The source 200 may be a USB host or a USB charger (AC adapter) with or without a host function.

The sink 300 includes USB Type-C compliant ports and controllers 303. USB Type-C corresponding port has an VBUS terminal, a ground terminal, a first configuration channel terminal (CC1 terminal) and a second configuration channel terminal (CC2 terminal). VBUS terminal and the GND terminal are connected to VBUS line and the GND line of the USB cable 100. One of CC1 terminal and CC2 terminal is connected to the CC-line of the USB-cable 100. In FIG. 1, CC1 terminal is connected to the CC-line. The sink 300 may be a USB peripheral.

Figure 2:
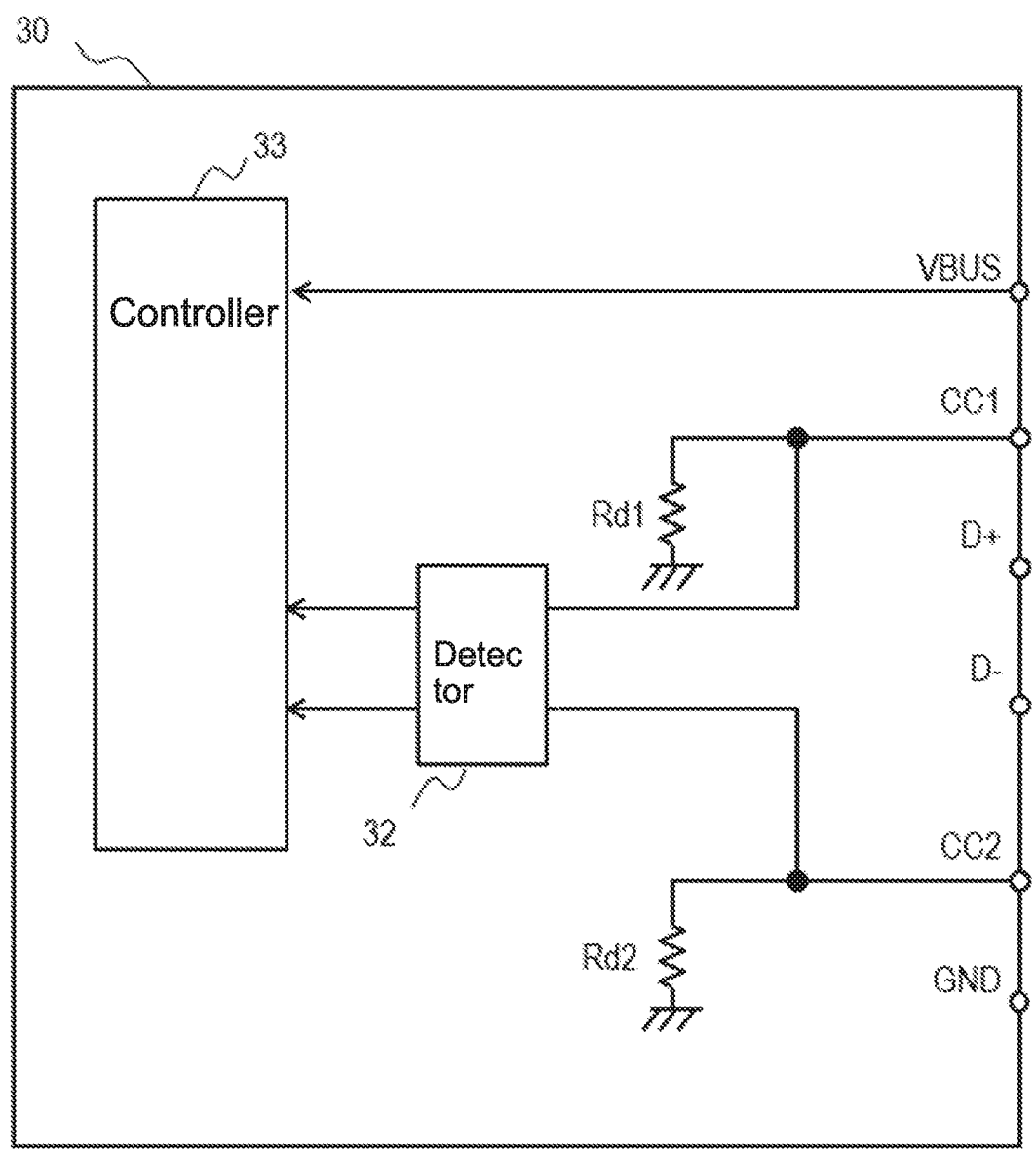
FIG. 2 is a block diagram showing a configuration of a sink having a typical USB Type-C port.

First, a general configuration of a sink having a USB Type-C port will be described with reference to FIG. 2. Sink 30 includes a pull-down resistor Rd1, Rd2, the controller 33, the detection circuit 33, VBUS terminal, the GND terminal, CC1 terminal, CC2 terminal, and a data terminal corresponding to USB2.0 (D+ terminal, D-terminal). CC1 terminal and CC2 terminal are terminated to the grounding potential GND via a pull-down resistor Rd1, Rd2. In USB Type-C standard, the resistance of the pull-down resistor Rd1, Rd2 is defined as 5.1 kΩ. Voltage of CC1 terminal and CC2 terminal is detected by the detector 32. Controller 33 identifies the connection status with the source based on the voltage level of CC1 terminal and CC2 terminal. Further, the controller 33 confirms the supply capability of the source based on the voltage of CC1 terminal or CC2 terminal connected to the CC line, performs a power receiving request corresponding to the supply capability of the source.

Figure 3:
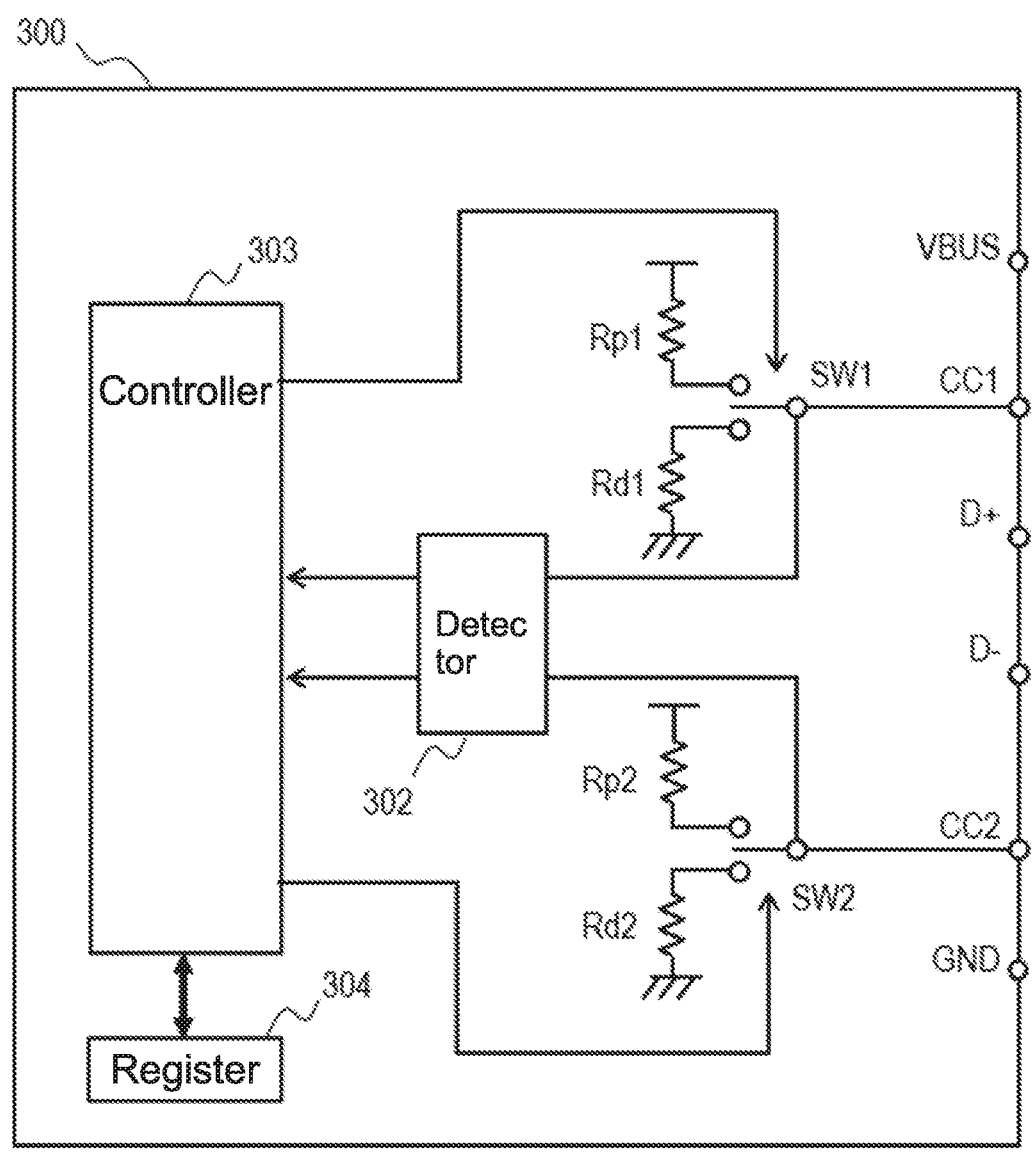
FIG. 3 is a block diagram showing an example of a configuration of a power receiving device according to the first embodiment.

FIG. 3 is a diagram illustrating a configuration of a sink 300 having USB Type-C ports according to the first embodiment. Similar to the sink 30, the sink 300 includes a pull-down resistor Rd1, Rd2, a detector 302, a controller 303, a CC1 terminal, a CC2 terminal, and a data terminal (D+ terminal, D– terminal). The sink 300 further includes a pull-up resistor Rp1, Rp2, a switching SW1, SW2, and a register 304. The sink 300 according to the first embodiment is an electronic device that supports only the sink function corresponding to USB Type-C, and does not support the source function. CC1 terminal can be regarded as a first terminal and CC2 terminal as a second terminal.

CC1 terminal is connected to the first pull-up resistor Rp1 or the first pull-down resistor Rd1 via the first switch SW1. CC2 terminal is connected to a second pull-up resistor Rp2 or a second pull-down resistor Rd2 via a second switch SW2. Switching SW1, SW2 is controlled by the controller 303. It should be noted that the pull-down resistor Rd1, Rd2 is used to identify the sinks, and is defined by 5.1 kΩ according to USB Type-C standard.

Detector 302 is connected to CC1 terminal and CC2 terminal, and detects the terminal voltage of CC1 terminal and CC2 terminal, respectively.

Controller 303 controls the switch SW1 and SW2, to determine the connection status and cable type based on the terminal voltage of CC1 terminal and CC2 terminal detected by the detection circuit 302. Further, the controller 303 makes a power reception request based on the connection state and the cable type.

The register 304 stores information indicating whether or not the connection with the source is detected and whether or not the cable type is determined.

Incidentally, the pull-up resistor Rp1, Rp2, the pull-down resistor Rd1, Rd2 and the detecting circuit 302 may be formed in one semiconductor chip together with the controller 303 and the register 304, it may be an external component.

The state of the sink 300 according to the present embodiment will be described with reference to FIG. 4.

The state ST1 is an (Unattached.SNK) state indicating a state in which the source 200 is not connected to the sink 300. Since the source 200 is not connected, the terminal voltage of CC1 terminal and CC2 terminal of the sink 300 indicates the ground potential GND connected to the pull-down resistor Rd1, Rd2.

The state ST2 is a sink connection standby state (Attach-Wait.SNK) indicating a state in which the sink 300 has detected that it is connected to the source 200. Sink 200, when the terminal voltage of CC1 terminal or CC2 terminal becomes equal to or higher than a predetermined voltage vRdmin, detects the connection with the source 200. This state is the sink-connection standby state (state ST2).

For example, when the sink 300 is connected to an external electronic device is a source 200 via a USB cable, either one of CC1 terminal and CC2 terminal is connected to the CC line in the USB cable. The CC line is connected to a pull-up resistor in source 200 if the USB cable is a USB Type-C to USB Type-C cable. Also, if the USB cable is a USB Type-C legacy cable, the CC line is connected to a pull-up resistor within the cable. Therefore, as shown in FIG. 1, when the sink 300 is connected to the source 200 via the USB cable 100, which is a USB Type-C legacy cable, the CC line is connected to CC1 terminal of the sink 300. Therefore, a voltage divided by the pull-down resistor Rd1 of the sink 300 and the pull-up resistor Rpc in USB Type-C legacy cable appears at CC1 terminal of the sink 300. Although not shown, when the sink 300 is connected to the source 200 via a USB cable, which is a USB Type-C to USB Type-C cable, a voltage divided by the pull-down resistor Rd1 of the sink 300 and the pull-up resistor of the source 200 appears at CC1 terminal of the sink 300. Therefore, the sink 300 can be determined that the terminal voltage of CC1 terminal is connected to the external electronic device to be the source 200 when a predetermined voltage range. Here, the source-connection is detected by being equal to or greater than the voltage vRdmin of the lower limit of the predetermined voltage range. Incidentally, the voltage vRdmin is specified by Type-C standard. For example, the voltage vRdmin is higher than the ground potential, i.e., GND, connected to a pull-down resistor Rd1 or Rd2.

The state ST3 is a state that detects for a certain period that the sink 300 is connected to the source 200, and transitions when VBUS supply from the source 200 is detected. This state is defined as a sink connection establishment state (Attached.SNK) indicating a state in which the connection as the sink 300 is established. Specifically, the sink 300, while confirming that the terminal voltage of CC1 terminal or CC2 terminal connected to the CC line maintains a predetermined voltage vRdmin or more over a predetermined period, when detecting the supply of the bus power supply voltage VBUS, the sink connection established state. Upon transitioning to the state ST3, the sink 300 begins receiving power from the source 200 and can operate as a normal USB-device. Incidentally, the sink 300 enters the state ST1 when the supply of the bus power supply voltage VBUS is removed source 200 is stopped.

The sink 300 according to the present embodiment further has a state ST4 that is a status for confirming the type of the USB cable. Status ST4, as a first state of connecting the pull-up resistor Rp1, Rp2 to CC1 terminal and CC2 terminal of the sink 300, a state of confirming the type of USB-cable connected to the sink 300 based on the terminal voltage of CC1 terminal and CC2 terminal. The transition to the state ST4 may be made from the state ST1 or from the state ST2.

In the state ST4, when it is detected that the connected USB cable is a USB Type-C to USB Type-C cable (first cable), the sink 300 again, in a state ST3 that has transitioned through the state ST1, ST2, after confirming the power supply capacity of the source 200 power receiving request with power based on the confirmed power supply capacity. On the other hand, in the state ST4, if it is not detected that the USB cable is a USB Type-C to USB Type-C cable, the sink 300 enters the state ST1. Then, the sink 300, again, in the state ST3 that has transitioned through the state ST1, ST2, without checking the power supply capacity of the source 200, the standard supply power (voltage 5 V, current 500 mA) defined by USB2.0 standard or USB 3.x standard power supply (voltage 5 V, current 900 mA) It performs a power receiving request at a predetermined power such as. Incidentally, hereinafter, these USB 2.0 standard or USB 3.x. The standard supplied power determined by the x standard is referred to as USB standard supplied power.

Figure 5:
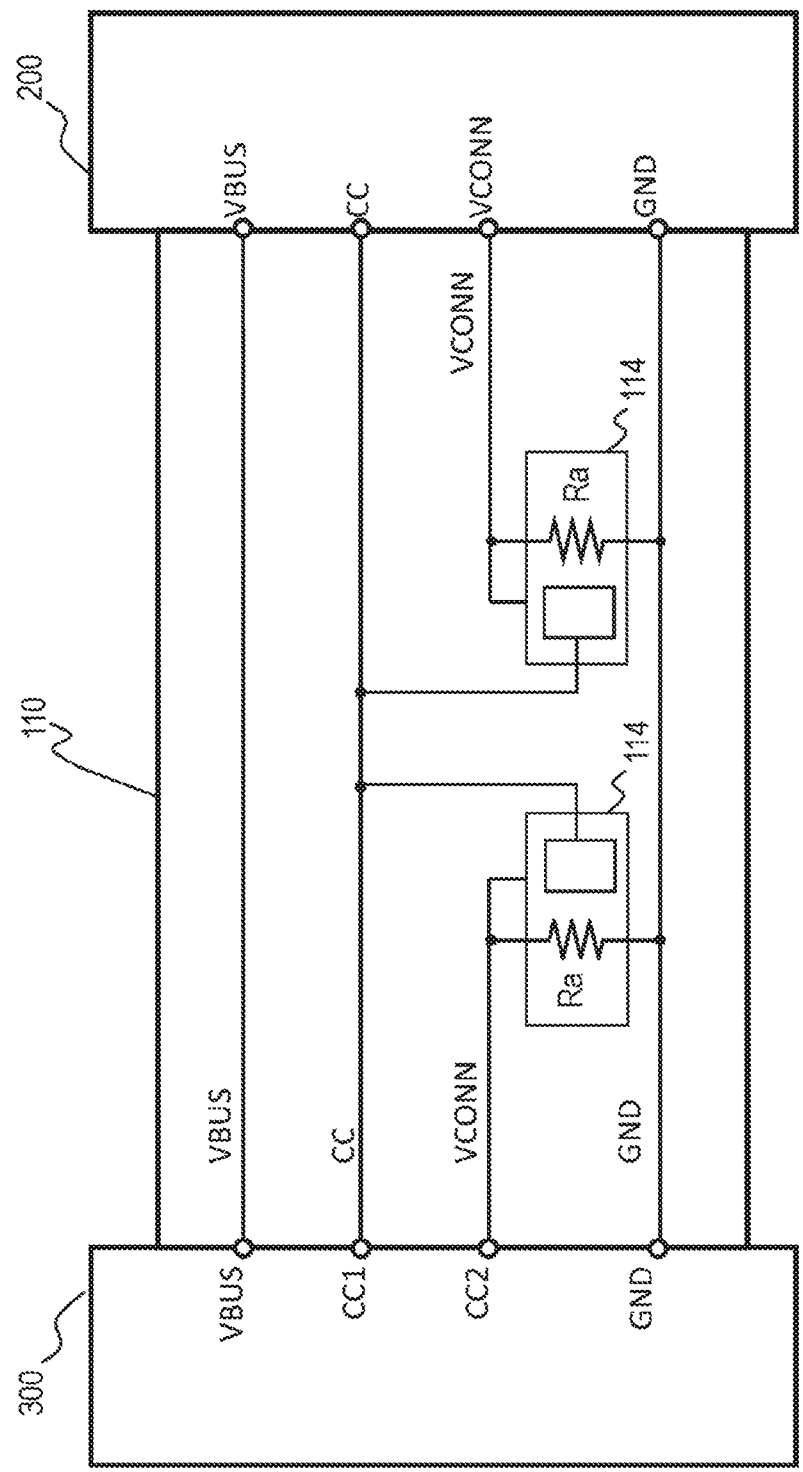
FIG. 5 is a block diagram illustrating an example of a configuration of a USB Type-C to Type-C cabling.

Here, USB Type-C to USB Type-C cabling will be described. As shown in FIG. 5, USB Type-C to USB Type-C cable 110, typically a plurality of devices 114 called E markers are provided. E marker 114 is built into the cable 110 to provide information about the characteristics of the cable 110, for example, the length of the cable, the amount of support power, and the like. USB Type-C to USB Type-C cables 110 are provided with a CC line and a VCONN line, and the E markers 114 are supplied with power from the sources 200 via VCONN lines. In the USB system compatible with USB PD, the E-marker 114 and the source 200 communicate with each other through the CC line, and the USB system realizes safe power supplying by checking the characteristics of the cable. A pull-down resistor R a connected to VCONN lines is mounted on the E-marker 114. Therefore, in FIG. 5, the pull-down resistor Ra is detected by monitoring the voltage of CC2 terminal connected to VCONN line. Here, when CC2 terminal voltage becomes voltage vRa or less, recognizes that CC2 terminal is connected to the pull-down resistor Ra. Unlike the pull-down resistor Rd1, Rd2, the resistance of the pull-down resistor Ra is set to 800Ω to 1.2 kΩ according to USB Type-C standard. Voltage vRa is specified by Type-C standard, a voltage lower than the voltage vRdmin.

Figure 4:
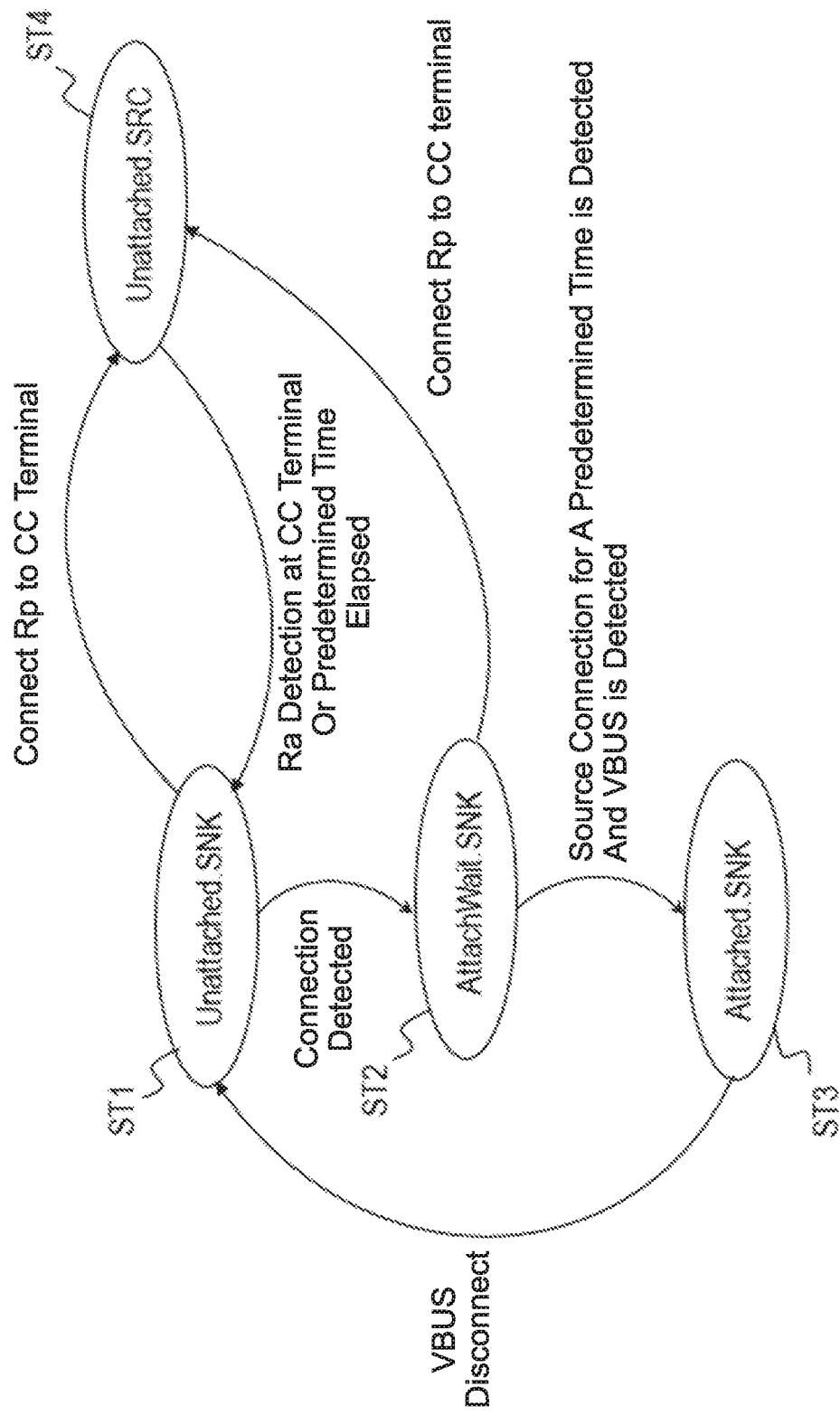
FIG. 4 is a state transition diagram showing an example of a state transition of the power receiving device according to the first embodiment.

Therefore, in the state ST4 of FIG. 4, the sink 300 detects the pull-down resistor R a to confirm the type of the USB cable. That is, in the status ST4, the sink 300 connects CC1 terminal and CC2 terminal to the pull-up resistor Rp1,Rp2, respectively, to monitor the voltage of CC1 terminal and CC2 terminal. When the connected USB cable is a USB Type-C to USB Type-C cable, the voltage of CC1 terminal or CC2 terminal is a voltage corresponding to the divided voltage of the pull-up resistor Rp1 (or Rp2) and the pull-down resistor Ra of the E-marker. Therefore, when the voltage of CC1 terminal or CC2 terminal becomes equal to or lower than the voltage vRa, the sink 300 determines that the pull-down resistor Ra of the E-marker exists, that is, the connected USB cable is a USB Type-C to USB Type-C cable. The detection result of the pull-down resistor Ra is stored in the register 304. The first state in which the pull-up resistor Rp1,Rp2 are respectively connected to CC1 terminal and CC2 terminal is equivalent to a state in which the electronic device operates as a source. Therefore, this first state is referred to as a source unconnected state (Unattached.SRC) in which the source 200 is not connected to the sinks 300.

Figure 6A:
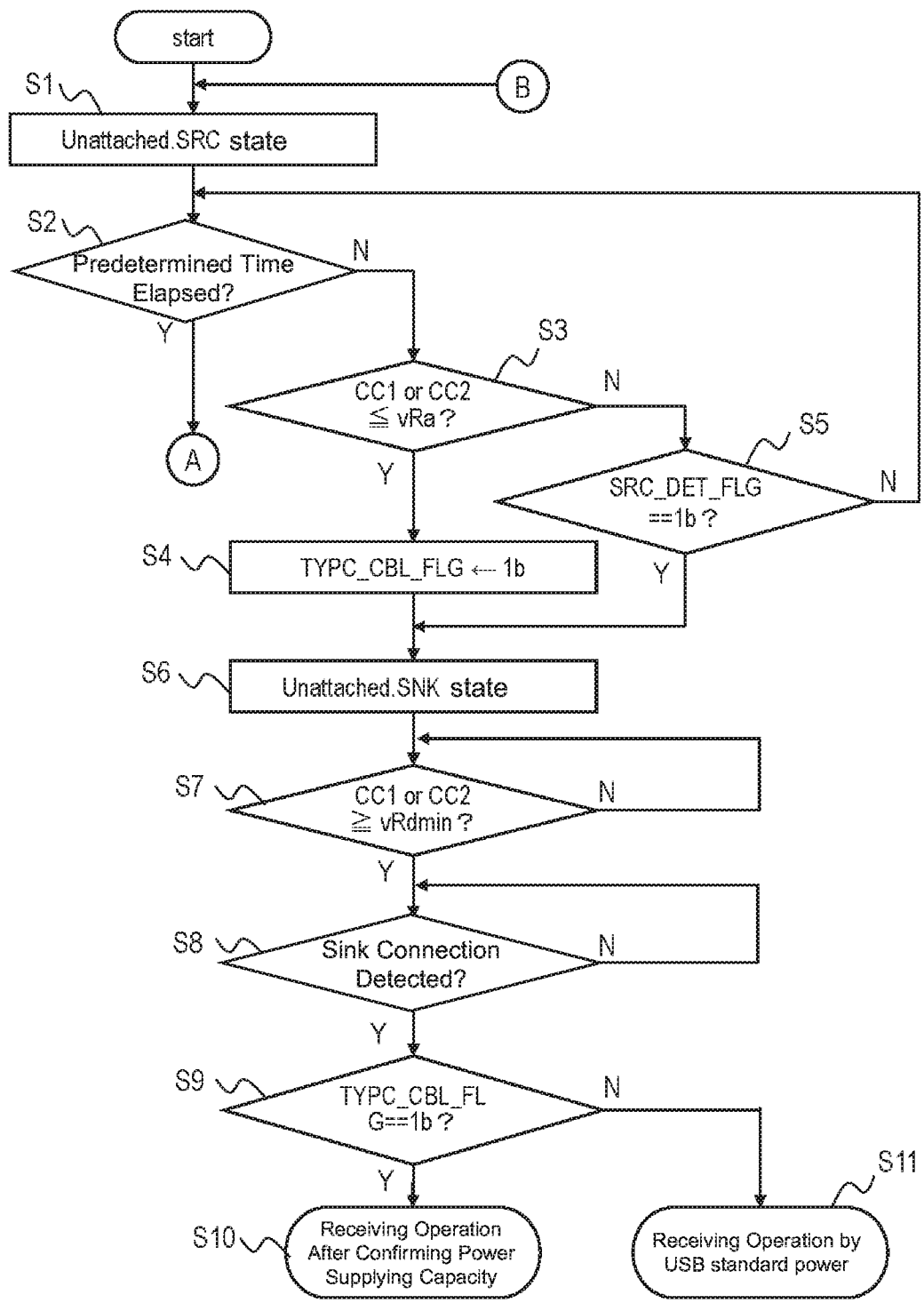
FIG. 6A is a flowchart illustrating an exemplary power receiving control of the power receiving device according to the first exemplary embodiment.
Figure 6B:
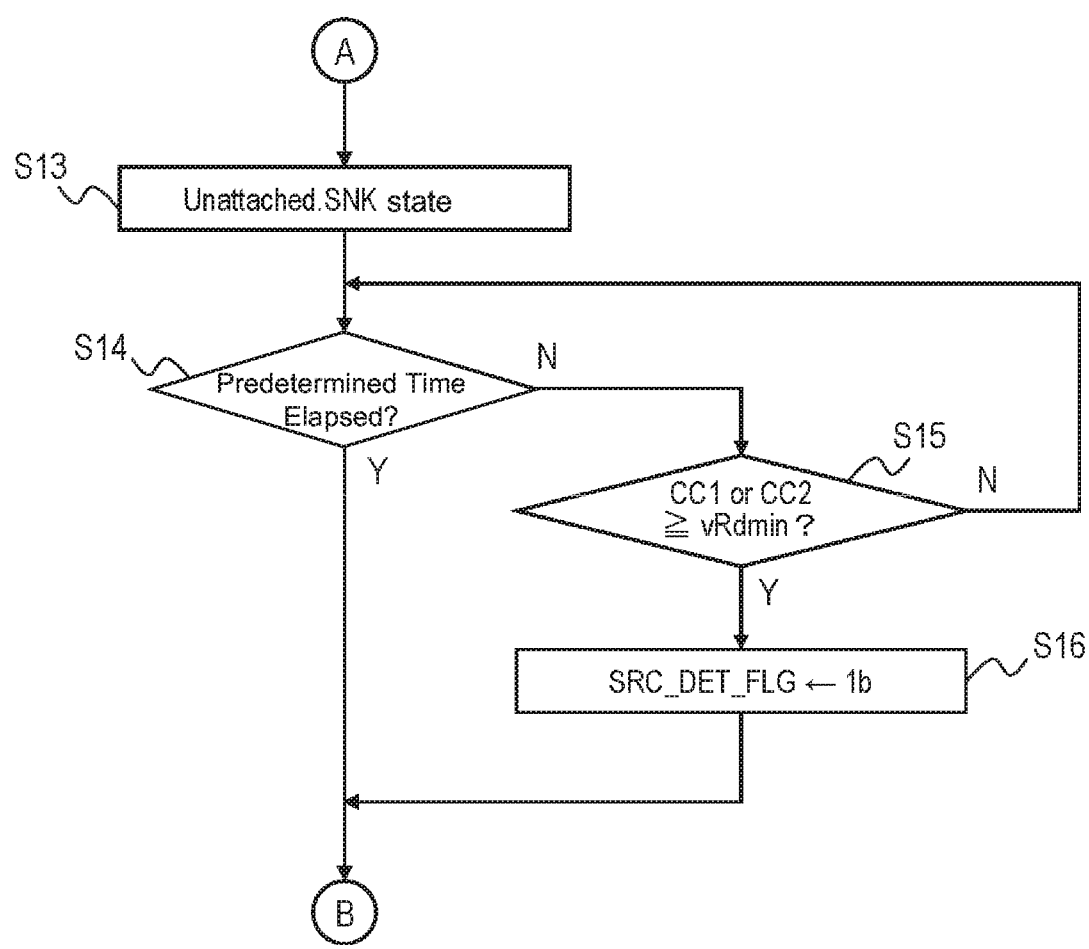
FIG. 6B is a flowchart illustrating an exemplary power receiving control of the power receiving device according to the first exemplary embodiment.

Referring to FIG. 6A and FIG. 6B, a power reception control process of the sink 300 will be described.

First, the sink 300, when the power is supplied, transitions to the source-unconnected state (state ST4 in FIG. 4). In the source unconnected state, the controller 303 controls the switch SW1, SW2 to connect a pull-up resistor Rp1, Rp2 to each of CC1 terminal and CC2 terminal (step S1). Thereafter, the process proceeds to step S2, and it is determined whether or not a predetermined time has elapsed. When the predetermined time has not elapsed (N in step S2), the process proceeds to step S3.

Next, the detecting circuit 302 determines whether the terminal voltage of CC1 terminal or CC2 terminal is equal to or less than the voltage vRa (step S3). That is, it is determined whether there is a pull-down resistor Ra of the E marker in the cable connected to the sink 300. When the voltage of CC1 terminal or CC2 terminal is equal to or lower than the voltage vRa (Y in step S3), the controller 303 recognizes that the connected cable is a USB Type-C to USB Type-C cable, sets the cable type flag TYPC_CBL_FLG to 1b, and stores the cable type flag TYPC_CBL_FLG in the register 304 (step S4). Incidentally, the voltage vRa is determined according to the resistance value of the pull-up resistor Rp1, Rp2 of the sink 300. For example, if the resistance of the pull-up resistor Rp1 and Rp2 of the sink 300 is connected to a 5 V power supply at 56 kΩ, the voltage vRa is set to 0.2 V. The voltage vRa when the resistance value of the pull-up resistor Rp1 and Rp2 of the sink 300 is 22 kΩ is 0.4 V, the voltage vRa when the resistance value of the pull-up resistor Rp1 and Rp2 is 10 kΩ is set to 0.8 V.

On the other hand, when both CC1 terminal voltage and CC2 terminal voltage is greater than the voltage vRa (N in step S3), it means that the pull-down resistor Ra is not detected. This indicates that the connected USB cable is not a USB Type-C to USB Type-C cable. At this time, since it is not known whether or not the source 200 is connected to the sink 300, the controller 303 reads the source connection detection flag SRC_DET_FLG indicating that the connection with the source 200 has been detected from the register 304, and checks whether or not the connection with the source 200 has been detected. If 1b is set in the source connection detection flag SRC_DET_FLG (Y in step S5), since the connection with the source 200 is already detected, the state proceeds to step S6 to continue the operation as the sink 300. If 1b is not set in the source-connection-detection flag SRC_DET_FLG (N in step S5), the process returns to step S2.

The controller 303, after setting the cable type flag TYPC_CBL_FLG (step S4), or after confirming that 1b source connection detection flag SRC_DET_FLG (Y in step S5), performs the connection confirmation process as the sink 300. That is, the sink 300 transitions to the sink unconnected state (state ST1 in FIG. 4) (S6). In the sink unconnected state, the controller 303 controls the switch SW1, SW2, and a second state for connecting the pull-down resistor Rd1, Rd2 to each of CC1 terminal and CC2 terminal.

The controller 303 checks the detected voltage of CC1 terminal and CC2 terminal in order to confirm the connection status (step S7). CC1 terminal or CC2 terminal connected to the CC-line, a voltage divided by the pull-up resistor Rpc in the pull-up resistor or cable 100 of the source 200 and the pull-down resistor Rd1 or Rd2 of the sink 300 appears. Controller 303, when either the terminal voltage of the terminal voltage and CC2 terminal of CC1 terminal is equal to or higher than the voltage vRdmin (Y in step S7), recognizes that the sink 300 is connected to the source 200. This state corresponds to the sink-connection standby state (state ST2 in FIG. 4). The voltage vRdmin is determined according to the resistance value of the pull-up resistor Rpc in the resistance value or the cable 100 of the pull-up resistor of the source 200. For example, if the resistance value of the pull-up resistor of the source 200 and the resistance value of the pull-up resistor Rpc in the cable 100 is connected to 5 V power supply at 56 kΩ, the voltage vRdmin is set to 0.2 V.

Thereafter, the controller 303 checks for a predetermined period, either CC1 terminal voltage and CC2 terminal voltage is equal to or higher than the voltage vRdmin, and whether the bus power supply voltage VBUS is supplied. As a result, the controller 303 checks whether or not the sink 300 is in a state in which a connection with the source 200 is established (a sink connection establishment state) (step S8).

When the controller 303 confirms that it has transitioned to the sink connection establishment state (state ST3 in FIG. 4) (Y in step S8), it reads the cable type flag TYPC_CBL_FLG from the register 304. If 1b is set in the cable type flag (Y in step S9), the controller 303 determines that the connection via USB Type-C to USB Type-C cable, the power supply capacity of the source 200 based on one of the terminal voltages of CC1 terminal and CC2 terminal connected to the CC line performs checking (step S10). On the other hand, when the cable type flag TYPC_CBL_FLG is not set (N in step S9), it is determined that the controller 303 is connected through USB Type-C legacy cable, and the controller 303 does not check the power supply capacity of the source 200 and makes a power reception request with the USB standard power supply (step S11). That is, the controller 303 makes a request for receiving power at the USB-standard supplied power without confirming the terminal voltages of CC1 pin and CC2 pin after transitioning to the sink-connection establishment state.

Meanwhile, in step S2, the pull-down resistor Ra of the E marker is not detected, and in step S5, the cable is not a USB Type-C to USB Type-C cable or the source 200 may not be connected if the source connection detection flag SRC_DET_FLG is not set. Therefore, when the state in which the pull-down resistor Ra of the E-marker is not detected and the source-connection detecting flag STC_DET_FLG is not set continues for a predetermined period of time, the sink 300 transitions to the sink-unconnected state (state ST1 in FIG. 4) in order to perform the connection confirming process (step S13 in 6B of the drawing). In the sink unconnected state, as described above, the controller 303 controls the switch SW1, SW2, and connects the pull-down resistor Rd1, Rd2 to CC1 terminal and CC2 terminal, respectively.

In the sink unconnected state of step S13, the detector circuit 302 detects the terminal voltage of CC1 terminal and CC2 terminal. Controller 303, when the detected CC1 terminal voltage or CC2 terminal voltage is equal to or higher than the voltage vRdmin (Y in step S15), sets 1b to the source connection detection flag SRC_DET_FLG as a source 200 detects that it is connected (step S16). At this time, the sink 300 is not a state in which the connection as the sink 300 is established, but a state in which the connection of the sources 200 is detected (a sink connection standby state (state ST2)). After detecting that the source 200 is connected, the process returns to step S1 in order to confirm the type of the cable.

When the non-sink connection state in step S13 continues for a predetermined period of time (Y in step S14), the process returns to step S1. The continuation of the sink unconnected state may be due to the fact that the cable is connected but the source 200 is not connected. Therefore, the sink 300 is shifted to the source-unconnected state (state ST4) in order to first determine the type of the cable. As a result, even when the source 200 is not connected, the type of the cable can be determined first, and the time taken from the establishment of the connection of the sink to the request for reception can be shortened.

In this manner, by connecting the pull-up resistor Rp1, Rp2 to CC1 and CC2 terminals of the sink 300 to the same state as the source-unconnected state, the type of the connected cables can be recognized. When the sink 300 is connected to the source 200 using a USB Type-C to USB Type-C cable, the sink 300, after confirming the power supply capacity of the source 200 from CC1 and CC2 terminal voltage, the power receiving request with power corresponding to the confirmed power supply capacity. On the other hand, if the cable other than USB Type-C to USB Type-C cable is connected, the sink 300, regardless of CC1 and CC2 terminal voltage, i.e., performs a power receiving request at a predetermined power such as USB-standard supplied power without confirming the power supply capability of the source 200. That is, the sink 300 confirms the power supply capability of the source 200 according to the type of the connected cable. Therefore, even when the resistance values of the pull-up resistors in USB Type-C legacy cables are not appropriate, the sinks 300 can safely receive power without requesting the sources 200 connected via USB Type-C non-compliant ports to receive power with excessive power.

(Modifications)

In the power reception control flow of the FIG. 6A, 6B, since the connection of USB Type-C to USB Type-C cables is preferentially confirmed, the sink 300 starts from the source-unconnected state (state ST4 in FIG. 4), but the present invention is not limited thereto. You may prefer to check the source connection before checking the cable type.

Figure 7:
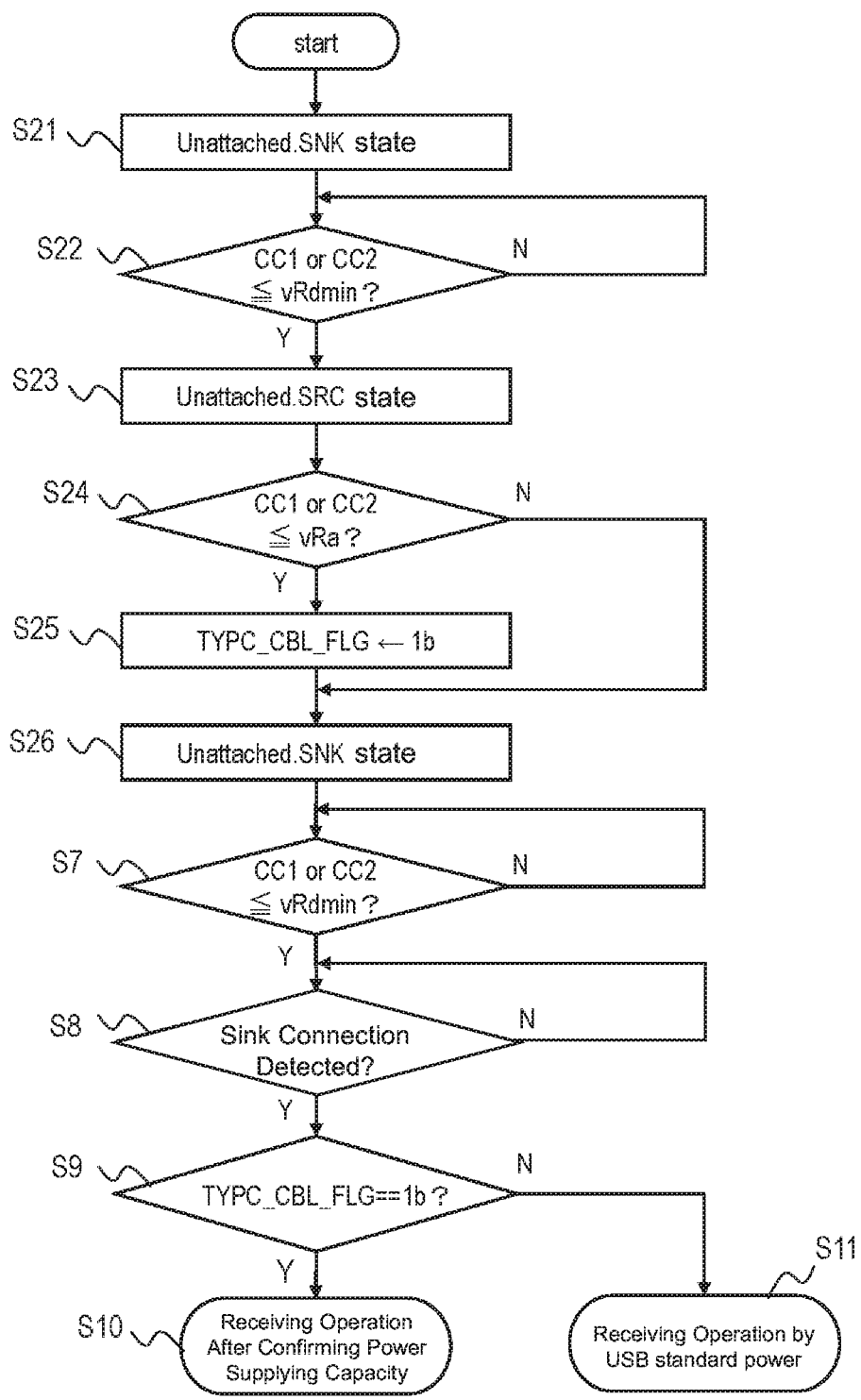
FIG. 7 is a flowchart showing an example of power receiving control of the power receiving device according to a modification of the first embodiment.

FIG. 7 shows a power reception control flow of the sink 300 which gives priority to the connection confirmation of the source 200.

First, when power is supplied to the sink 300, the sink 300 is a sink unconnected state (state ST1 in FIG. 4) (step S21). Step S21 is the same process as step S13 in the drawing 6B, and therefore the explanation thereof is omitted. Controller 303, when CC1 terminal voltage and CC2 terminal voltage detected by the detection circuit 302 is equal to or higher than the voltage vRdmin (Y in step S22), detects that the source 200 is connected. Incidentally, in the power receiving control flow according to the FIG. 6A and FIG. 6B, the controller 303 detects the source connection, but has set the source connection detection flag SRC_DET_FLG is not required in this modification.

After detecting the source connection, the controller 303 transitions to the source unconnected state (state ST4 in FIG. 4) in order to confirm the type of cable (step S23). That is, the controller 303 controls the switch SW1, SW2 to connect the pull-up resistor Rp1 and Rp2 to CC1 and CC2 terminals. In this condition, the detector 302 detects the terminal voltage of CC1 terminal and CC2 terminal. Controller 303, when detecting that CC1 terminal voltage or CC2 terminal voltage is equal to or less than the voltage vRa (Y in step S24), recognizes that the connected cable is a USB Type-C to USB Type-C cable, sets 1b in the cable type flag TYPC_CBL_FLG, and stores it in the register 304 (step S25). On the other hand, when both CC1 terminal voltage and CC2 terminal voltage are equal to or higher than the voltage vRa (N in step S24), it is recognized that the connected cable is not USB Type-C to USB Type-C cable, and the process proceeds to step S26 without setting the cable type flag TYPC_CBL_FLG.

Step S26 is a state ST1 of FIG. 4 in which the sink is not connected. In step S26, the controller 303 controls the switch SW1, SW2 to connect the pull-down resistor Rd1 and Rd2 to CC1 and CC2 terminals. The subsequent flow is the same as the flow after step S7 in FIG. 6A, and the same reference numerals are given to the respective steps, and descriptions thereof are omitted.

Also in the modification of the first embodiment, the type of the connected cable can be recognized by setting the sink 300 to the same state as the source unconnected state. Therefore, it is possible to prevent the sinks 300 from making excessive power reception requests to the sources 200 when connected by USB Type-C legacy cables. Further, in the present modification, since the source connection detection flag is not required, the processing can be simplified.

Embodiment 2

Next, Embodiment 2 will be described. Embodiment 2 differs from Embodiment 1 in that an electronic device operating as a sink has a power operation mode of USB dual-roll power.

USB Type-C defines three USB-port power operating modes. Source only, sink only, and dual roll power (hereinafter referred to as DRP) power mode of operation. The source 200 operates only as a power supply device, and the sink 300 operates only as a power receiving device, but the DRP can operate both as a power supply device and as a power receiving device. In the second embodiment, the power receiving control when the electronic device corresponding to DRP operates as a sink will be described.

Figure 8:
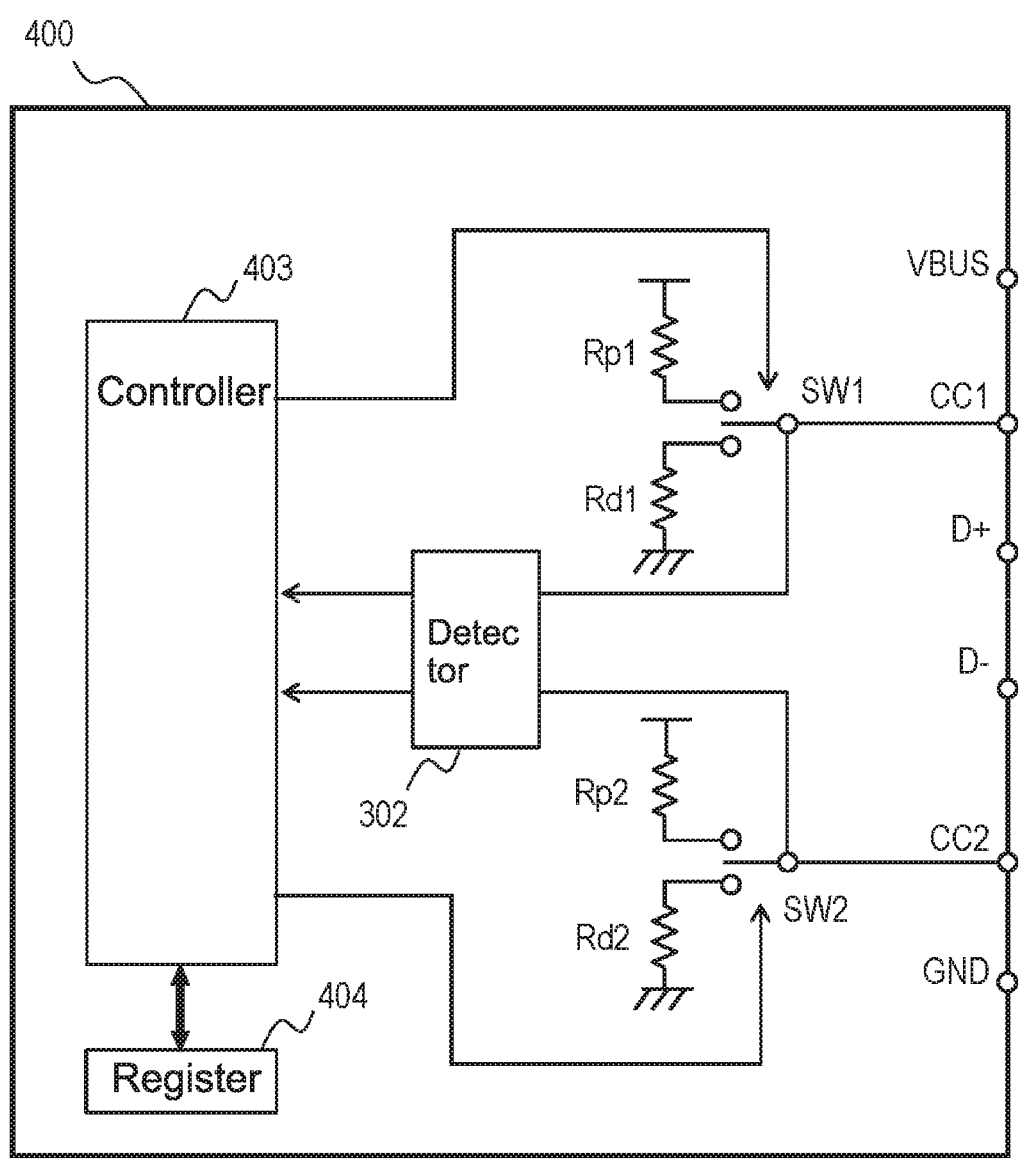
FIG. 8 is a block diagram showing an example of a configuration of an electronic device according to the second embodiment.

FIG. 8 shows an exemplary configuration of a DRP-capable electronic device 400 of USB Type-C. The electronic device 400 includes a pull-up resistor Rp1, Rp2 and a pull-down resistor Rd1, Rd2 because it is also operable as a sink 300 as a source 200. The electronic device 400 also includes a detection circuit 302, a switch SW1, SW2, a controller 403 and a register 404. Switching SW1, SW2, the detecting circuit 302 may be the same as that shown in FIG. 3, here, denoted by the same reference numerals, and a description thereof will be omitted.

Controller 403 controls the switch SW1, SW2, a first state in which CC1 terminal and CC2 terminal and the pull-up resistor Rp1, Rp2 is connected, and a second state in which CC1 terminal and CC2 terminal and the pull-down resistor Rd1, Rd2 is connected is switched periodically. When the external electronic device serving as a source 200 to the electronic device 400 is connected, the electronic device 400 detects the connection when the second state pull-down resistor Rd1, Rd2 is connected to CC1 terminal and CC2 terminal. On the other hand, when the external electronic device serving as a sink 300 to the electronic device 400 is connected, the electronic device 400 detects the connection when the first state connected to the pull-up resistor Rp1, Rp2 to CC1 terminal and CC2 terminal.

Register 404 stores the source connection detection flag SRC_DET_FLG indicating whether or not the source 200 has been detected, the cable type flag TYPC_CBL_FLG indicating the cable type, and the connection cable type determination execution flag CBL_CHK_FLG indicating whether or not to perform the determination process of the type of the connected cable.

Figure 9:
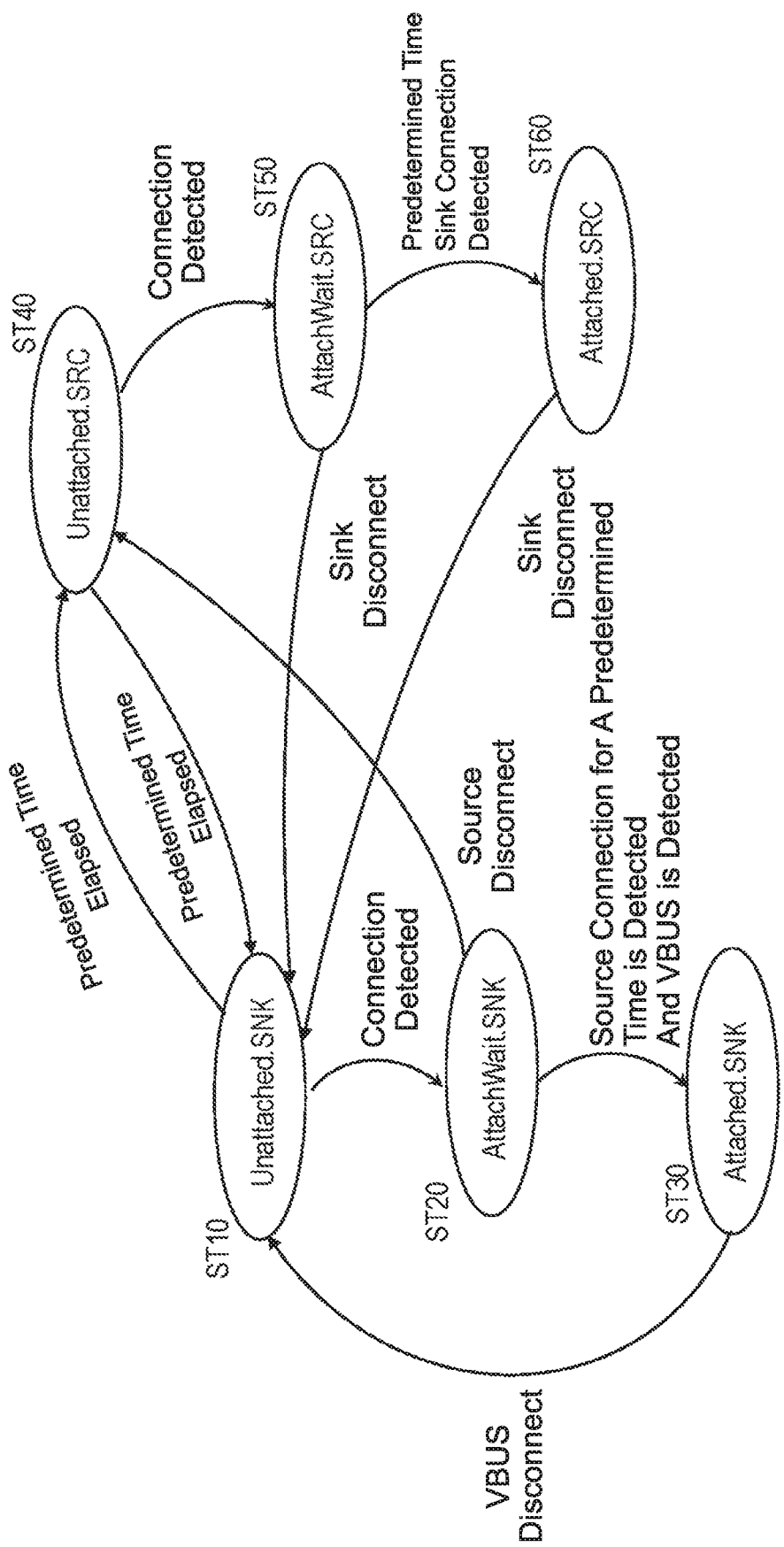
FIG. 9 is a state transition diagram showing an example of state transition of the electronic apparatus according to the second embodiment.

FIG. 9 is a diagram of the connection-state transitions in the DRP operation of USB Type-C. The power reception control according to the second embodiment will be described with reference to FIG. 9.

In the DRP operation, a sink-unconnected state (Unattached.SNK) (state ST10) in which the pull-down resistor Rd1,Rd2 is connected to CC1 terminal and CC2 terminal and a source-unconnected state (Unattached.SRC) (state ST40) in which the pull-up resistor Rp1, Rp2 is connected to CC1 terminal and CC2 terminal are switched at predetermined times defined in USB Type-C standard. In each state, state transitions are performed according to the detected voltage of CC1 terminal or CC2 pin. Normally, in the sink unconnected state (state ST10), when detecting that the source 200 is connected due to a voltage change of CC1 terminal or CC2 terminal, the electronic device transitions to the sink connection standby state (AttachedWait.SNK) (state ST20), and when a predetermined condition is satisfied, the electronic device transitions to the sink connection establishment state (Attached.SRC). On the other hand, in the source unconnected state (state ST40), when detecting that the sink 300 is connected due to a voltage change of CC1 terminal or CC2 terminal, the electronic device transitions to the source connection standby state (AttachWait.SRC) (state ST50), and when a predetermined condition is satisfied, the electronic device transitions to the sink connection establishment state (Attached.SRC) (state ST60).

In the second embodiment, the data held in the register 404 is used in order for the electronic device 400 to transit from the sink connection standby state (state ST20) to the sink connection establishing state (Attached.SNK) (state ST30). Details will be described with reference to the flow charts of FIGS. 10A and 10B.

Figure 10A:
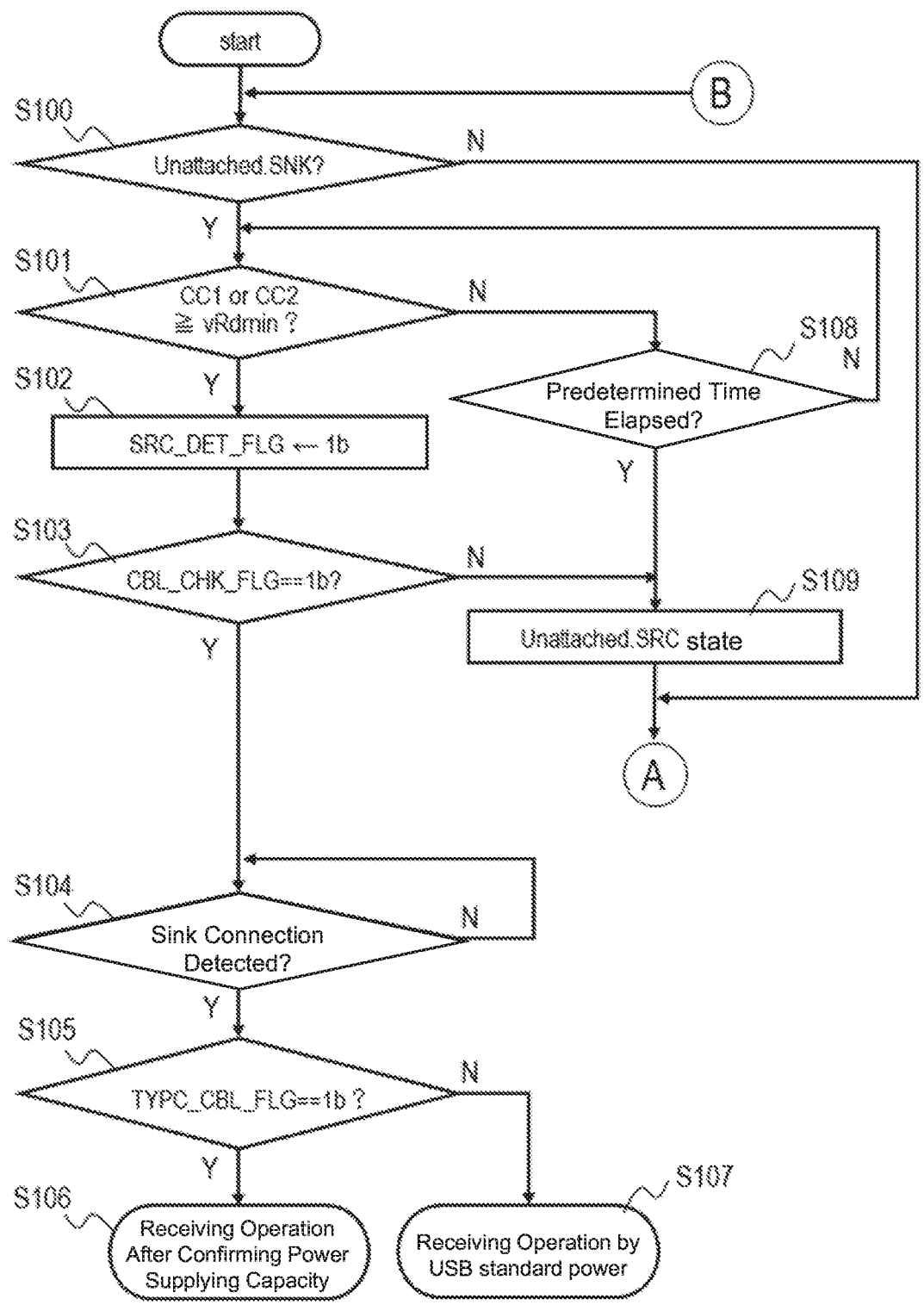
FIG. 10A is a flowchart showing an example of power reception control of the electronic apparatus according to the second embodiment.
Figure 10B:
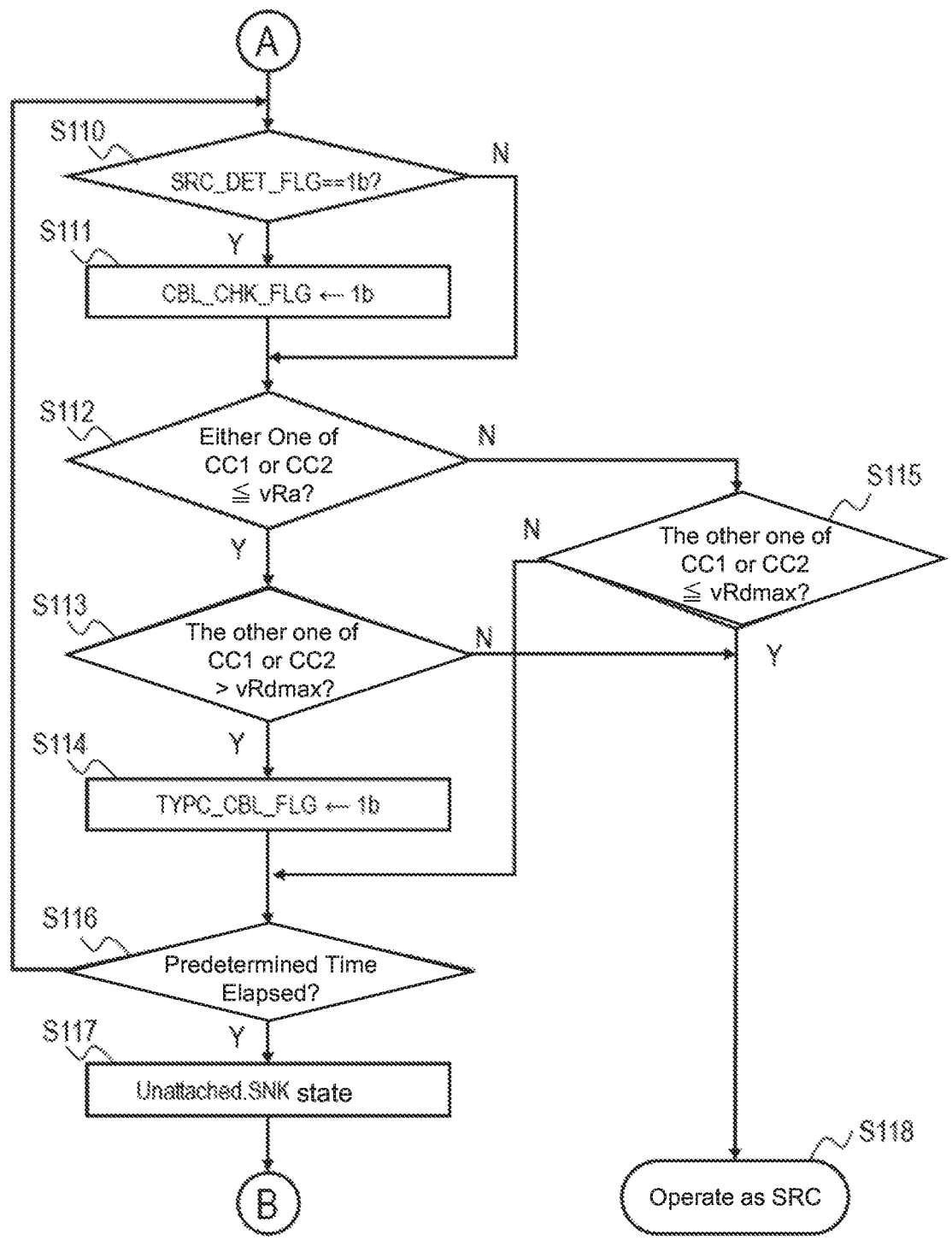
FIG. 10B is a flowchart showing an example of power reception control of the electronic apparatus according to the second embodiment.

FIGS. 10A and 10B are power reception control flows according to the second embodiment.

As described above, during DRP operation switches the sink unconnected state (Unattached.SNK) (state ST10) in which the pull-down resistor Rd1, Rd2 is connected to CC1 terminal and CC2 pin, and the source unconnected state (Unattached.SRC) (state ST40) in which the pull-up resistor Rp1, Rp2 is connected to CC1 pin and CC2 pin in a predetermined time.

The controller 403, when the pull-down resistor Rd1, Rd2 is connected to CC1 terminal and CC2 terminal (Y in step S100), same to the first embodiment either the terminal voltage of CC1 terminal or CC2 terminal, the voltage vRdmin or more (Y in step S101), it determines that the external electronic device functioning as a source is connected. That is, the electronic device 400 transitions to the sink-connection standby state (state ST20 in FIG. 9). The controller 403 sets 1b and stores it in the register 404 (step S102) in the source-connection detection flag SRC_DET_FLG. That is, the source connection detection flag SRC_DET_FLG is set when the connection with the source 200 is detected while the electronic device 400 indicates the sink 300.

Then, the controller 403 reads the connection cable determination implementation flag CBL_CHK_FLG stored in the register 404, to confirm whether 1b is set in the connection cable type determination implementation flag CBL_CHK_FLG (step S103). Controller 403, if it is set to 1b (Y in step S103) the connection cable type determination implementation flag CBL_CHK_FLG, continues the process as the sink 300. That is, the controller 403 checks whether or not in a state of establishing a connection with the source 200 (step S104).

When the controller 403 enters the sink connection establishment state (state ST30 in FIG. 9) by establishing a connection with the source (Y in step S104), it reads the cable type flag TYPC_CBL_FLG from the register 404. If 1b is set (Y in step S105), the controller 403 recognizes that the connection through USB Type-C to USB Type-C cable, CC1 terminal connected to the CC line and CC2 terminal through either one to perform a power receiving request after confirming the power supply capability of the source 200 (step S106). On the other hand, the controller 403 does not check the power supply capacity of the source 200 as a connection through a USB Type-C legacy cable that is not a USB Type-C to USB Type-C cable (N in the step S105) when the cable type flag TYPC_CBL_FLG is not set, but makes a power reception request with USB standard power supply (step S107).

On the other hand, when 1b is not set in the connection-cable-type determination execution flag CBL_CHK_FLG (N in step S103), the controller 403 controls the switching SW1, SW2 to connect CC1 terminal and CC2 terminal to the pull-up resistor Rp1, Rp2 (step S109). That is, the controller 403 controls to transit to the source unconnected state (state ST40 in FIG. 9) is an operating state as the source 200. Further, in step S101, if the voltage of CC1 terminal and CC2 terminal is not equal to or greater than the voltage vRdmin within a predetermined time, respectively (Y in step S101, Y in step S108), also to operate the electronic device 400 as a source 200, the controller 403 controls the switch SW1, SW2 to transit to the source unconnected state.

When the electronic device 400 enters the source unconnected state, the controller 403 reads the source connection detection flag SRC_DET_FLG from the register 404 (step S110). The fact that 1b is set (Y in step S110) in the source connection detection flag SRC_DET_FLG indicates that the electronic device 400 has already detected a connection with the source as sink 300. Therefore, the controller 403, the subsequent processing determines that the electronic device 400 is a process for obtaining the cable type required to operate as the sink 300, sets 1b in the connection cable type determination implementation flag CBL_CHK_FLG and stores it in the register 404 (step S111).

If no 1b is set in the source connection detection flag SRC_DET_FLG, i.e., the source connection of the electronic device 400 is not detected (N in step S110), it indicates that the electronic device 400 is not determined to operate as the sink 300. Therefore, the electronic device 400 continues the connection confirmation process as a source.

Next, the controller 403 checks whether one of the terminal voltages of CC1 terminal and CC2 terminal is equal to or less than the voltage vRa (step S112). In this step S112, it is checked whether or not the cable connected to the electronic device 400 is a USB Type-C to Type-C cable. If the electronic device 400 which is set to the source unconnected state is connected to the source 200 via a USB Type-C to Type-C cable, since either one of CC1 terminal and CC2 terminal is connected to the cable pull-down resistor Ra, one of the terminal voltages of CC1 terminal and CC2 terminal becomes voltage vRa or less. On the other hand, when the terminal voltages of CC1 terminal and CC2 terminal are both higher than the voltage vRa, this indicates that the connecting cable is a USB Type-C legacy cable. This is because USB Type-C legacy cable does not have the E-marker pull-down resistor R a. Therefore, by checking whether one terminal voltage of CC1 terminal and CC2 terminal is equal to or less than the voltage vRa, it is possible to determine the type of connecting cable.

If one terminal voltage of CC1 terminal and CC2 terminal is equal to or less than the voltage vRa (Y in the stepped S112), i.e., the connecting cable is determined to be a USB Type-C to Type-C cable, the controller 403 confirms that it is not connected to the sink 300 based on the other terminal voltage of CC1 terminal and CC2 terminal. Since the pull-up resistor is connected to CC1 terminal and CC2 terminal in the stepped S109, the other terminal voltage of CC1 terminal and CC2 terminal is connected to the sink 200 having a pull-down resistor Rd is a predetermined voltage range (voltage vRdmin or higher, the voltage vRdmax or less). Therefore, if higher than the voltage vRdmax of the upper limit of the predetermined voltage range, it can be determined that the external electronic device connected is not the sink 300. Therefore, the controller 403 checks whether the other terminal voltage of CC1 terminal and CC2 terminal is higher than the voltage vRdmax (step S113). If the other terminal voltage of CC1 terminal and CC2 terminal is higher than the voltage vRdmax (Y in step S113), the controller 403 recognizes that it is not connected to the sink. Incidentally, the voltage vRdmax is lower than the power supply potential connected to the pull-up resistor Rp1, Rp2, for example, is defined by Type-C standard.

Then, the controller 403, in step S112, to indicate that the connection cable is determined to be USB Type-C to USB Type-C, and stores the register 404 by setting a 1b in the cable type flag TYPC_CBL_FLG (step S114).

On the other hand, when the other terminal voltage of CC1 terminal and CC2 terminal is equal to or less than the voltage vRdmax (N in step S113), the controller 403 recognizes that the electronic device 400 is connected to the sink 300, the electronic device 400 source-connected standby state (ST50 of FIG. 9) to transit to. Thereafter, when the state in which the sinks 300 are connected continues for a predetermined period, the electronic device 400 transitions to the source connection-established state (ST60 in FIG. 9), and the controller 403 starts the operation as the source 200 (step S118).

If the terminal voltage of one of CC1 terminal and CC2 terminal is not equal to or lower than the voltage vRa (N in step S112), that is, if it is determined that the connecting cable is a USB Type-C legacy cable, the controller 403 detects in step S115 whether or not the electronic device 400 is connected to the sink 300. Therefore, the controller 403 determines whether the terminal voltage of either CC1 terminal and CC2 terminal is equal to or less than the voltage vRdmax. If either one of CC1 terminal and CC2 terminal is not below the voltage vRdmax (N in step S115), the controller 403 recognizes that the electronic device 400 is not connected to the sink 300, the process proceeds to step S116. On the other hand, if the terminal voltage of either CC1 terminal and CC2 terminal is equal to or less than the voltage vRdmax (Y in step S115), the controller 403 recognizes that the electronic device 400 is connected to the sink 300, the operation as the source 200 starts (step S118).

Thus, the controller 403 confirms the type of the connecting cable (step S112), after determining that it is not connected to the sink 300 (Y of step S113, N of S115), if a predetermined time has elapsed (Y of step S116), the electronic device 400 in order to perform the operation as the sink 300 transitions to the sink unconnected state (step S117). That is, the controller 403 controls to connect a pull-down resistor to CC1 terminal and CC2 terminal, and returns to the step S100.

As described above, even when USB Type-C DRP-compliant electronic device operates as the sink 300, the DRP-compliant electronic device performs power reception control after determining the type of cables. Thus, when USB Type-C DRP-capable electronic devices operate as sink 300, even if they are connected via USB Type-C legacy cables, they can prevent the external source 200 from requesting excessive power. As a result, it is possible to safely receive power in power supply systems using USB Type-C legacy cables. Also, USB Type-C DRP-compliant electronics have pull-up and pull-down resistors to prevent excessive power reception requirements without the addition of new components.

If all USB Type-C DRP-compatible electronic devices control the status of their USB Type-C using the firmware, the type of cable can be checked without changing the hardware configuration.

The invention made by the present inventor has been described above based on the embodiment, but the present invention is not limited to the above embodiment, and it is needless to say that various modifications can be made without departing from the gist thereof.

What is claimed is:

1. An electronic device connected to an external power supply device via a cable, the electronic device comprising:
   a first terminal and a second terminal at least either one of which is connected to a signal line of the cable;
   a detection circuit configured to detect voltages of the first terminal and the second terminal;
   a controller configured to determine a type of the cable based on detected one of voltages of the first terminal and the second terminal, and confirm a power supply capacity of the external power supply device according to the type of the cable; and
   a first pull-up resistance, a second pull-up resistance, a first pull-down resistance, and a second pull-down resistance,
   wherein the type of the cable is determined by connecting the first terminal and the second terminal to the first pull-up resistance and the second pull-up resistance, respectively; and
   wherein the power supply capacity is confirmed by connecting the first terminal and the second terminal to the first pull-down resistance and the second pull-down resistance, respectively, after the type of the cable is determined.

2. The electronic device according to claim 1,
   wherein the controller is configured to confirm the power supply capacity and request for receiving power based on the confirmed power supply capacity when the controller determines that the type of the cable is a first type according to the confirmed power supply capacity; and
   wherein the controller is configured to request for receiving a predetermined power without confirming the power supply capacity when the controller determines that the type of the cable is not the first type according to the confirmed power supply capacity.

3. The electronic device according to claim 2, wherein the first type is USB Type-C to Type-C cable.

4. The electronic device according to claim 2, wherein the predetermined power is defined in USB 2.0 standard or USB 3.x standard.

5. The electronic device according to claim 1, wherein the first and the second terminals are configuration channel terminals according to USB Type-C standard.

6. The electronic device according to claim 1, wherein the electronic device is a power receiving device.

7. An electronic device connected to an external power supply device via a cable, the electronic device comprising:
   a first terminal and a second terminal at least either one of which is connected to a signal line of the cable;
   a detection circuit configured to detect voltages of the first terminal and the second terminal; and
   a controller configured to determine a type of the cable based on detected one of voltages of the first terminal and the second terminal, and confirm a power supply capacity of the external power supply device according to the type of the cable,
wherein the electronic device is capable of operating as a power supplying device or a power receiving device; and
wherein, when the electronic device detects connection with the external power supply device, the electronic device transitions its operation to an operation as the power supplying device, and the controller determines the type of the cable according to the detected voltages of the first terminal and the second terminal.

8. The electronic device according to claim 7, further comprising a register configured to store a type of a cable determination flag which indicates that the determination of the type of the cable is already performed,
wherein the controller is further configured to:
confirm the type of the cable determination flag when the electronic device detects the connection with the external power supply device;
maintain the operation as a power receiving device when the type of the cable determination flag indicates that the determination is already performed; and
transition the operation of the electronic device to the operation as the power supplying device, and determines the type of the cable according to the detected one of the voltages of the first terminal and the second terminal, when the type of the cable determination flag indicates that the determination is not already performed.

9. The electronic device according to claim 8,
wherein the register is further configured to store a source connection detection flag which indicates that the connection with the external power supply device is detected;
wherein the controller activates the type of the cable determination flag if the source connection detection flag indicates that the connection with the external power supply device is detected when the operation of the electronic device transitions to the operation as the power supplying device.

10. An electronic device that is connected to an external power supply device via a cable and that performs as a power receiving device, the electronic device comprising:
a first terminal connected to the cable, and connected to a first pull-up resistance or a first pull-down resistance via a first switch;
a second terminal connected to the cable, and connected a second pull-up resistance or a second pull-down resistance via a second switch;
a controller configured to:
when the first and second terminals are connected to the first and second pull-up resistances, respectively, determine a type of the cable according to a voltage of the second terminal;
when the first and second terminals are connected to the first and second pull-down resistances, respectively, determine connection with the external power supply device according to a voltage of the first terminal; and
check a power supply capacity of the external power supply device according to the type of the cable.

11. A method for controlling power receiving of an electronic device which is connected to an external power supply device via a cable, the method comprising:
determining a type of the cable according to a first terminal and a second terminal which are connected to the cable;
detecting connection with the external power supply device according to voltages of the first and second terminals; and
confirming a power supply capacity of the external power supply device when the connection with the external power supply device is determined,
wherein the electronic device is not capable of performing as a power supplying device; and
wherein the electronic device comprises pull-up resistances and pull-down resistances that are connected to the first terminal and the second terminal via switches, respectively
wherein the method further comprises:
connecting the pull-up resistances to the first terminal and the second terminal, respectively, before the determining of the type of the cable; and
connecting the pull-down resistances to the first terminal and the second terminal, respectively, after the determining of the type of the cable.

12. The method according to claim 11, wherein the first and second terminals are configuration channel terminals according to USB Type-C standard.

* * * * *